US010199029B2

(12) United States Patent
Hsu et al.

(10) Patent No.: US 10,199,029 B2
(45) Date of Patent: Feb. 5, 2019

(54) SPEECH ENHANCEMENT FOR HEADSETS WITH IN-EAR MICROPHONES

(71) Applicant: MediaTek Inc., Hsinchu (TW)

(72) Inventors: Chao-Ling Hsu, Hsinchu (TW); Yiou-Wen Cheng, Hsinchu (TW); Chih-Ping Lin, Zhubei (TW); Chieh-Cheng Cheng, Hsinchu (TW)

(73) Assignee: MediaTek, Inc., Hsinchu (TW)

( * ) Notice: Subject to any disclaimer, the term of this patent is extended or adjusted under 35 U.S.C. 154(b) by 0 days.

(21) Appl. No.: 15/344,713

(22) Filed: Nov. 7, 2016

(65) Prior Publication Data

US 2017/0372691 A1 Dec. 28, 2017

Related U.S. Application Data

(60) Provisional application No. 62/353,586, filed on Jun. 23, 2016.

(51) Int. Cl.
*G10K 11/16* (2006.01)
*H03B 29/00* (2006.01)
*G10K 11/178* (2006.01)
*H04R 1/10* (2006.01)

(52) U.S. Cl.
CPC ........ *G10K 11/178* (2013.01); *G10K 11/1784* (2013.01); *H04R 1/1016* (2013.01); *H04R 1/1041* (2013.01); *G10K 2210/3044* (2013.01); *H04R 2420/07* (2013.01); *H04R 2460/01* (2013.01)

(58) Field of Classification Search
CPC . G10K 11/1784; H04R 1/1016; H04R 1/1041
See application file for complete search history.

(56) References Cited

U.S. PATENT DOCUMENTS 9,607,602 B2 * 3/2017 Po ........................ G10K 11/175
2002/0143242 A1 * 10/2002 Nemirovski ......... H04B 1/3877 600/300
2009/0012786 A1 * 1/2009 Zhang ................. G10L 21/0208 704/233
2009/0080670 A1 * 3/2009 Solbeck ............... H04R 25/453 381/71.6
2010/0131269 A1 * 5/2010 Park ..................... G01K 11/178 704/233

(Continued)

FOREIGN PATENT DOCUMENTS

WO WO 2015192218 A1 * 12/2015 ............ A61B 5/125

OTHER PUBLICATIONS

Kuo, et al., "Active Noise Control: A Tutorial Review", Proceedings of the IEEE, vol. 87, No. 6, Jun. 1999.

*Primary Examiner* — Simon King
(74) *Attorney, Agent, or Firm* — Tong J. Lee

(57) ABSTRACT

An earpiece of a headset uses a first signal and a second signal received from an in-ear microphone and an outside microphone, respectively, to enhance microphone signals. The in-ear microphone is positioned at a proximal side of the earpiece with respect to an ear canal of a user, and the outside microphone is positioned at a distal side of the earpiece with respect to the ear canal. A processing unit includes a filter, which digitally filters out in-ear noise from the first signal using the second signal as a reference to produce a de-noised signal to thereby enhance the microphone signals.

20 Claims, 7 Drawing Sheets

(56) References Cited

U.S. PATENT DOCUMENTS

| | | | | | |
|---|---|---|---|---|---|
| 2014/0126734 | A1* | 5/2014 | Gauger, Jr. | H04R 3/002 | 381/71.6 |
| 2014/0126756 | A1* | 5/2014 | Gauger, Jr. | A61F 11/14 | 381/309 |
| 2015/0382100 | A1* | 12/2015 | Azmi | H04R 1/1091 | 381/380 |
| 2016/0165361 | A1* | 6/2016 | Miller | H04R 25/43 | 381/317 |
| 2017/0150908 | A1* | 6/2017 | Nadon | A61B 5/125 | |
| 2017/0194020 | A1* | 7/2017 | Miller | G10L 25/51 | |

* cited by examiner

SPEECH ENHANCEMENT FOR HEADSETS WITH IN-EAR MICROPHONES

CROSS-REFERENCE TO RELATED APPLICATIONS

This application claims the benefit of U.S. Provisional Application No. 62/353,586 filed on Jun. 23, 2016.

TECHNICAL FIELD

Embodiments of the invention relate to enhancement of microphone signals transmitted from a headset that includes at least an in-ear microphone and an outside microphone.

BACKGROUND

A typical headset combines a microphone with headphone speakers for both ears. The microphone is typically encased in a tubular structure proximal to a user's mouth to receive the user's speech signal. When the speech signal travels from the user's mouth through the air into the microphone, the signal quality may be degraded by ambient noise as the microphone is exposed to the external environment.

Some advanced headsets incorporate a microphone as part of an earpiece that covers or fits into a person's ear. The earpiece forms a seal that blocks the ambient noise from entering the ear and allows the microphone to pick up a user's speech directly from the user's ear structure. The resulting microphone signal has improved signal to noise ratio (SNR) due to less noise disturbance, but in some situations the ambient noise may leak through the earpiece into the ear, and, due to frequency distortion in the speech signal propagation path, the speech may sound muffled or even unintelligible.

Thus, there is a need for improving the sound quality of microphone signals transmitted by an in-ear microphone.

SUMMARY

In one embodiment, a method is provided for enhancing microphone signals transmitted from an earpiece of a headset. The method comprises: receiving a first signal and a second signal from an in-ear microphone and an outside microphone, respectively. The in-ear microphone is positioned at a proximal side of the earpiece with respect to an ear canal of a user, and the outside microphone is positioned at a distal side of the earpiece with respect to the ear canal. The method further comprises: digitally filtering out in-ear noise from the first signal using the second signal as a reference to thereby produce a de-noised signal.

In another embodiment, an apparatus is provided for enhancing microphone signals transmitted from an earpiece of a headset. The apparatus comprises: an in-ear microphone positioned at a proximal side of the earpiece with respect to an ear canal of a user to receive a first signal; an outside microphone positioned at a distal side of the earpiece with respect to the ear canal to receive a second signal; and a processing unit, which includes a filter to digitally filter out in-ear noise from the first signal using the second signal as a reference to thereby produce a de-noised signal.

By processing the signals received from the in-ear microphone and the outside microphone, the quality and intelligibility of the microphone signals can be significantly enhanced.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention improve the quality and intelligibility of microphone signals produced and transmitted by an in-ear microphone of a headset. The headset includes at least a pair of microphones in an earpiece that fits into a user's ear. The headset can be connected to a device, such as a computer, communication and/or multimedia device, via a wired or wireless connection. A processing unit is operative to reduce noise and improve signal quality by processing the signals received from the at least two microphones. In one embodiment, the processing unit performs digital active noise cancellation. In an alternative embodiment, the processing unit performs acoustic active noise cancellation in addition to digital active noise cancellation. In yet another embodiment, the processing unit performs frequency shaping in addition to digital and/or acoustic active noise cancellation.

Figure 1A:
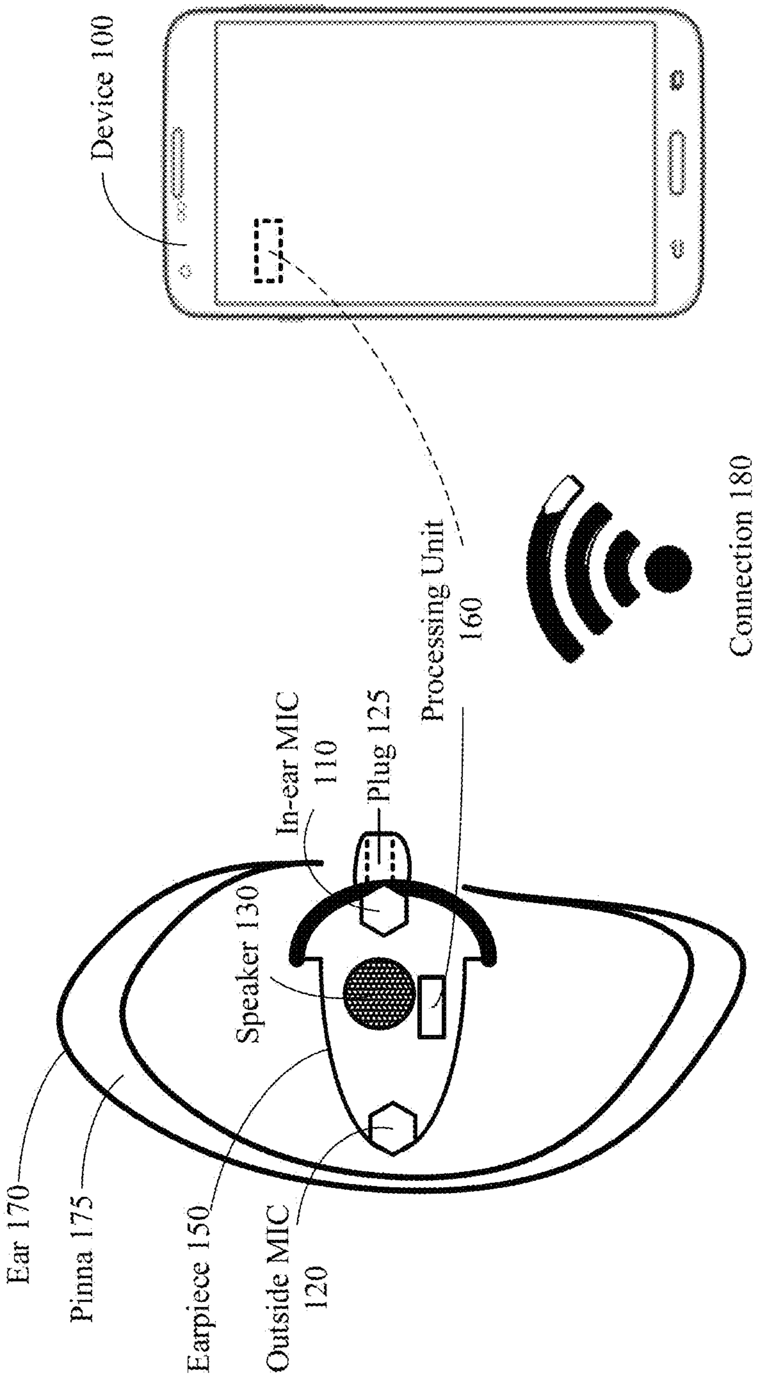
FIG. 1A is a diagram of an earpiece according to one embodiment.

FIG. 1A is a diagram of an earpiece 150 in communication with a device 100 according to one embodiment. The earpiece 150 may be connected to the device 100 by a wired or wireless connection 180 according to a known communication protocol. The device 100 may be a computer, a smartphone, a game station, an audio system, a multimedia system, or another stationary, portable, wearable electronic device. In one embodiment, the earpiece 150 is part of a headset assembly to be worn by a user. The headset assembly may include two of the earpieces 150 for both ears of a user. The two earpieces 150 may be separate earpieces, or may be connected by a connector to be positioned over, below, behind or otherwise around the head of a user.

The earpiece 150 includes at least a pair of microphones. The pair of microphones include an in-ear microphone (MIC) 110 located at a proximal side of the earpiece 150, and an outside microphone 120 located at a distal side of the earpiece 150, where "proximal" and "distal" are relative to the ear canal of a user. In the embodiment of FIG. 1A, the thick solid curve as shown at the right side of the earpiece 150 outlines the proximal side of the earpiece 150. When in use, the in-ear microphone 110 is positioned proximal to the ear canal of a user's ear 170; e.g., within or at the top end of the ear canal, and the outside microphone 120 is positioned outside the ear canal and is directed away from the ear 170. In one embodiment, when in use, the entire earpiece 150 including both the in-ear microphone 110 and the outside microphone 120 are positioned within the pinna 175 of the ear 170.

In one embodiment, the earpiece 150 may be attached to the ear 170 by partially or entirely inserting a plug 125 (which may be hollow axially as shown in dotted lines) at the proximal side into the ear canal of the user. In another embodiment, the earpiece 150 may not include the plug 125 and the proximal side of the earpiece 150 may stay at the top end of the ear canal, where the earpiece 150 is attached to the ear 170 by an extension structure that rests on top of the ear 170, at least partially around the ear 170, at least partially around the head, or other attach means. It is understood that the examples listed above are for illustration purposes only and numerous variations of the attach means may exist.

In one embodiment, the earpiece 150 includes a processing unit 160 for enhancing the received microphone signals. In an alternative embodiment, the device 100 includes the processing unit 160 for enhancing the received microphone signals. In yet another alternative embodiment, the processing unit 160 may be partially in the earpiece 150 and partially in the device 100.

Figure 1C:
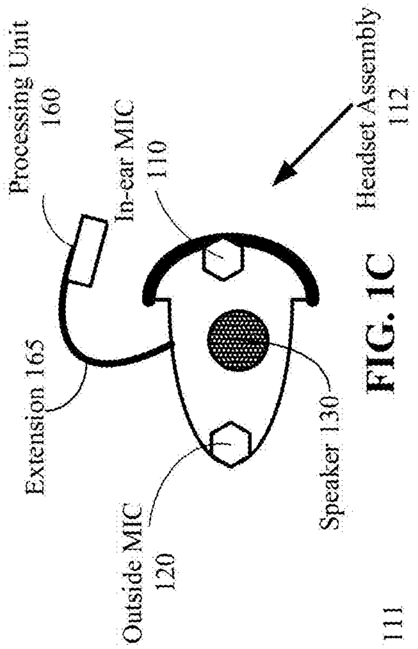
FIGS. 1B, 1C, 1D and 1E illustrate different configurations of earpiece components according to alternative embodiments.
Figure 1B:
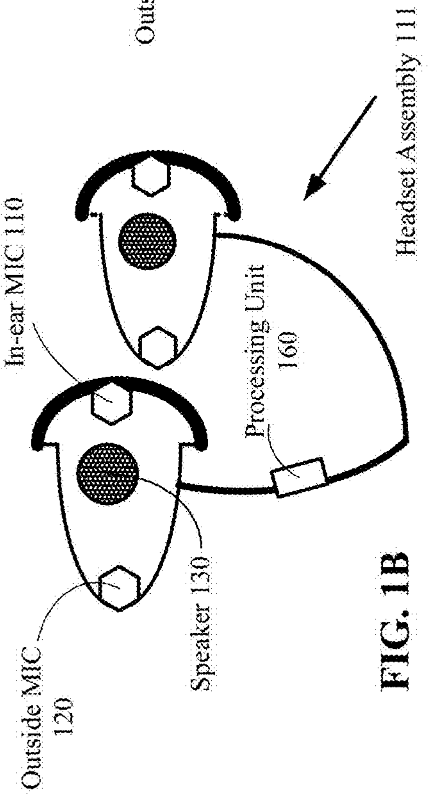

In other embodiments, the processing unit 160 may be located, partially or entirely, in a headset assembly external to the earpiece 150. In one embodiment, the processing unit 160 may be partly in the headset assembly and partly in the device 100. FIG. 1B illustrates a headset assembly 111 that includes two earpieces 150 connected by wire or wires, and FIG. 1C illustrates a headset assembly 112 that includes at least one earpiece 150 with an extension 165 to be placed at least partially around an ear. For example, in FIG. 1B, the processing unit 160 may be attached to a wire that extends from one earpiece 150; in FIG. 1C, the processing unit 160 may be attached to the extension 165. It is understood that the examples listed above are for illustration only and numerous variations exist with respect to the placement of the processing unit 160.

Figure 2:
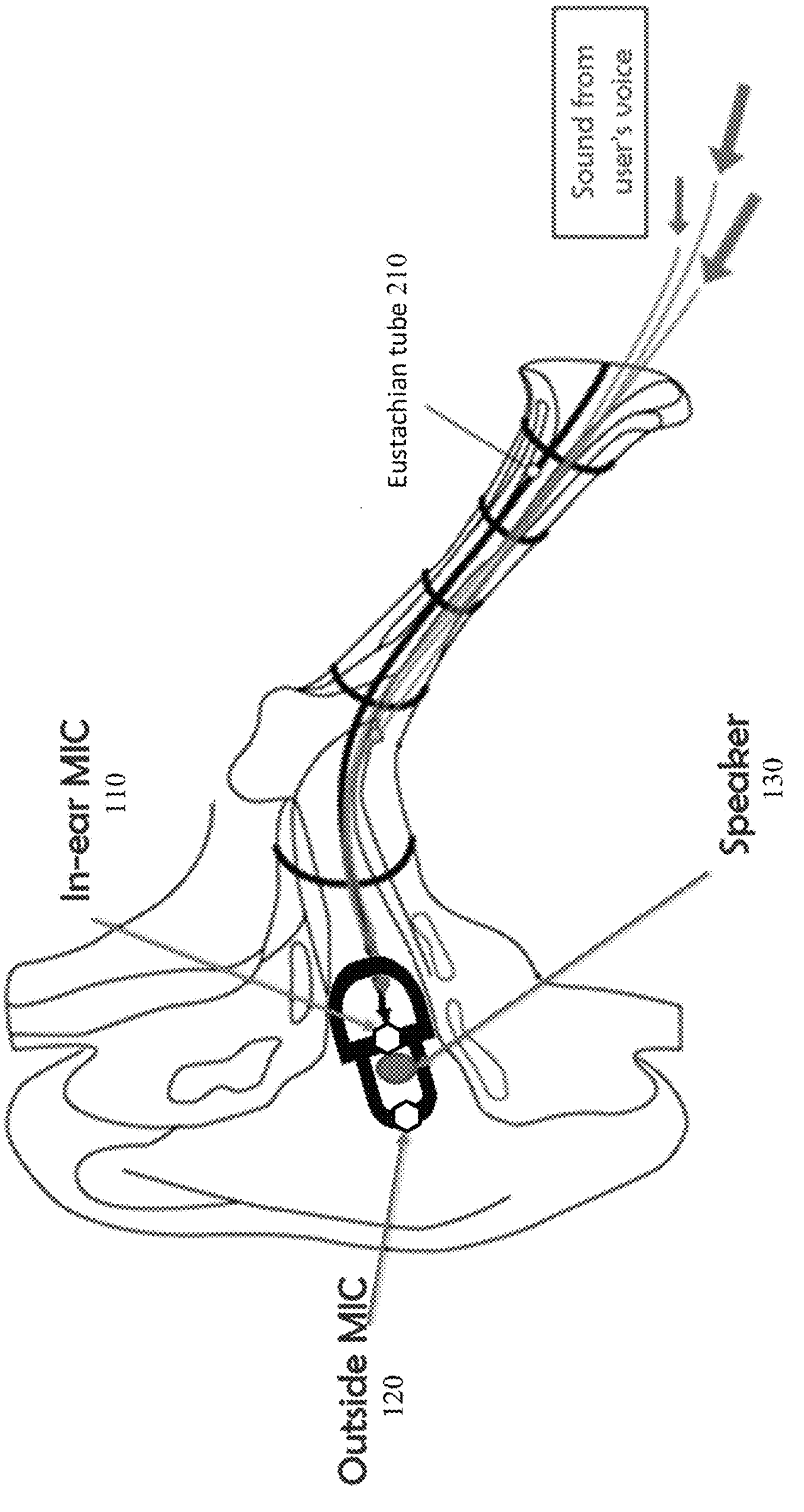
FIG. 2 illustrates the position of an earpiece in an ear according to one embodiment.

Referring also to FIG. 2, the position of the earpiece 150 in an ear is illustrated according to another embodiment. FIG. 2 shows that the in-ear microphone 110 receives a first signal, which includes a user's speech signal propagating through the user's Eustachian tube 210 and the outside noise leaking from outside the ear into the ear canal. The outside microphone 120 receives a second signal, which is the outside noise such as the ambient noise. The outside noise may also include the user's self-noise, which is the voice that transmits from the user's mouth, propagates in the air and back to the user's ear. The self-noise may be distorted by noise, echo and reverberation, and may act as a noise source. The processing unit 160 reduces not only the ambient noise, but also the self-noise. Reducing the self-noise may improve the speech quality and intelligibility.

The earpiece 150 delivers microphone signals (also referred to as an uplink signal) from both microphones 110 and 120 via the connection 180 to the device 100. The earpiece 150 may further include a speaker 130, which produces speaker signals (also referred to as a downlink signal) transmitted from the device 100 to the earpiece 150.

Figure 1E:
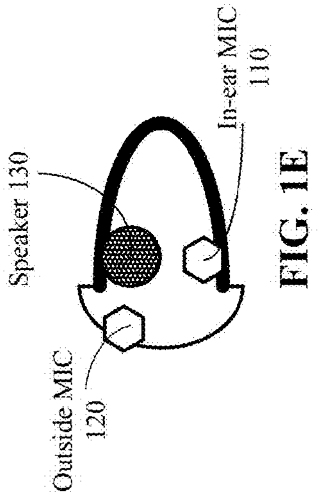
Figure 1D:
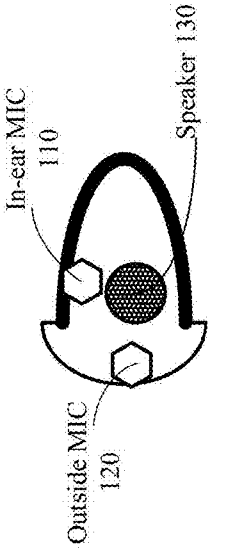

FIG. 1D and FIG. 1E illustrate additional variations of the earpiece 150 according to alternative embodiments. For example, the shape of the earpiece 150 in FIGS. 1D and 1E is reversed horizontally from what is shown in FIGS. 1B and 1C. Other variations of the earpiece shape may also exist. With respect to the placement of the microphone and the speaker components, the in-ear microphone 110 may be placed anywhere at the proximal side (which is outlined by the thick solid line), the outside microphone 120 may be placed anywhere at the distal side (which is the side of the earpiece 150 that faces outside), and the speaker 130 may be placed anywhere in the earpiece 150 and in any relative position with respect to the microphones 110 and 120. For simplicity of the illustration, components other than 110, 120 and 130 are omitted from FIGS. 1D and 1E. It is understood that the examples listed above are for illustration purposes only and numerous variations may exist.

In some embodiments, the earpiece 150 may include multiple in-ear microphones 110 and/or multiple outside microphones 120. For example, multiple in-ear microphones 110 can form a beamforming phase array, which utilizes directional information from different in-ear microphones 110 to enhance the quality of the received signal. More specifically, the beamforming phased array of in-ear microphones 110 can constructively combine the individual signal of each in-ear microphone 110 to enhance the SNR of the received signal in a given direction, and destructively combine the individual signal of each in-ear microphone 110 to reduce interference in other directions. Similarly, in an embodiment where the earpiece 150 includes multiple outside microphones 120, individual signal of each outside microphone 120 can be destructively combined in some directions to reduce the impact of certain noise or interference sources. In some embodiments, the multiple in-ear microphones 110 and/or multiple outside microphones 120 may be arranged in a linear, 2D or 3D pattern to enhance the signal quality.

Figure 3:
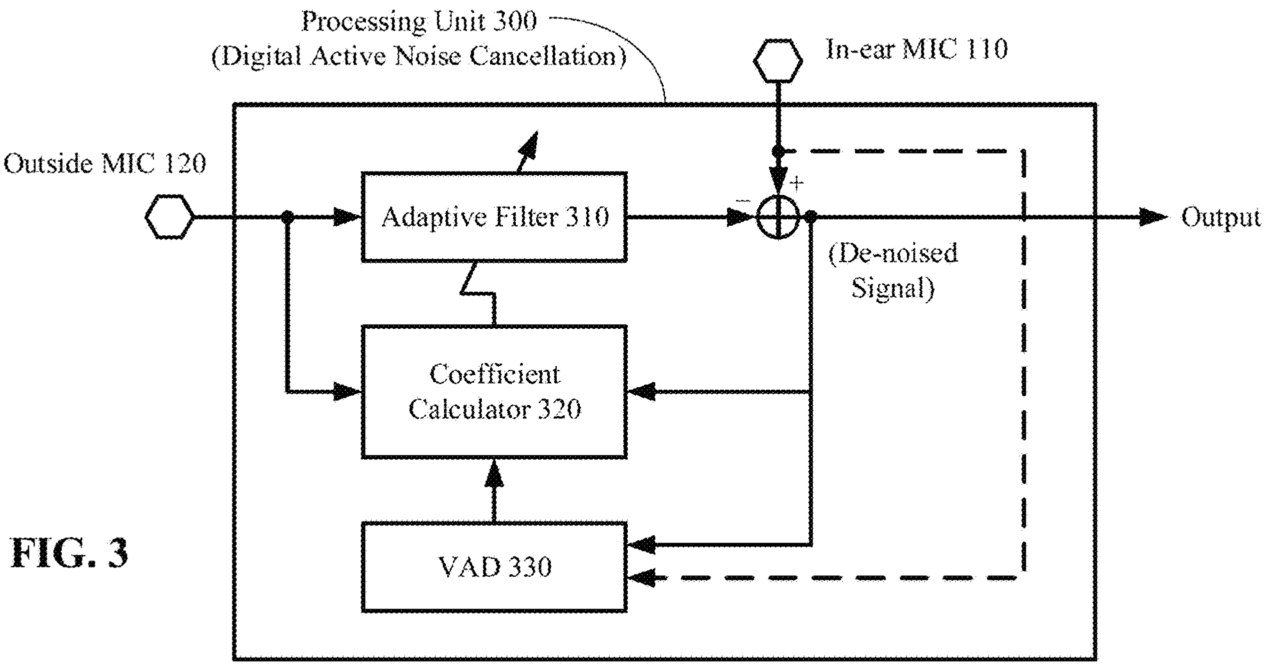
FIG. 3 illustrates a processing unit that performs digital active noise cancellation according to one embodiment.

FIG. 3 illustrates a processing unit 300 that performs digital active noise cancellation according to one embodiment. The processing unit 300 is one example of the processing unit 160 in FIGS. 1A, 1B and 1C. The processing unit 300 receives and processes the signals from microphones 110 and 120 to generate a de-noised signal as output. The processing unit 300 includes signal processing circuitry, which may be placed in the earpiece 150, in a headset assembly that includes the earpiece 150, or in the device 100. Alternatively, a portion of the signal processing circuitry may be placed in the earpiece 150 or in the headset assembly, and the other portion of the signal processing circuitry may be placed in the device 100. The processing unit 300 may include hardware, software, firmware, or a combination thereof.

In the embodiment shown in FIG. 3, the processing unit 300 includes an adaptive filter 310, which uses the signal received from the outside microphone 120 as a reference to remove the noise in the signal received from the in-ear microphone 110. The adaptive filter 310 may be a Least Mean Squares (LMS) filter, a normalized LMS filter, or any other adaptive filters. The processing unit 300 further includes a coefficient calculator 320, which calculates and updates a set of filter coefficients for the adaptive filter 310 based on the signals received from the outside microphone 120 and the in-ear microphone 110. The set of filter coefficients defines the transfer function of the adaptive filter 310.

In one embodiment, the coefficient calculator 320 calculates the filter coefficients only when the speech signal from the user is absent; that is, when the signal received from the in-ear microphone 110 contains only in-ear noise and no speech signal. The in-ear noise is the outside noise that leaks through the seal of the earpiece 150 into the user's ear canal. The coefficient calculator 320 may be coupled to a voice activity detector (VAD) 330, which detects the presence of the user's speech signal. The input to the VAD 330 may be directly from the in-ear microphone 110, or the de-noised signal from the output of the processing unit 300.

Figure 4:
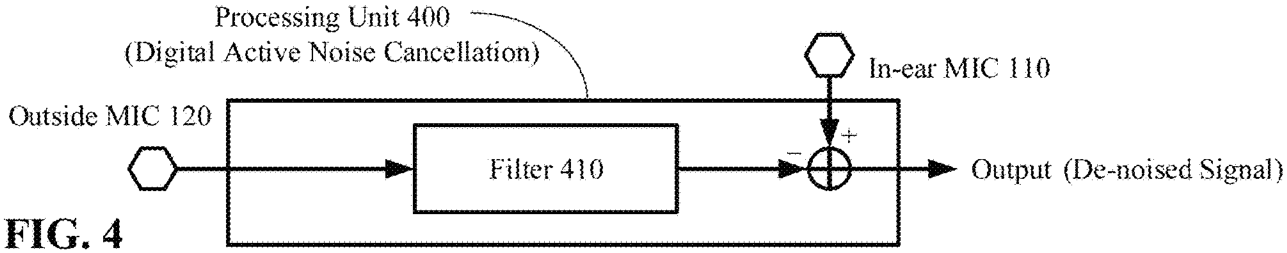
FIG. 4 illustrates a processing unit that performs digital active noise cancellation according to another embodiment.

FIG. 4 illustrates a processing unit 400 that performs digital active noise cancellation according to another embodiment. The processing unit 400 is another example of the processing unit 160 in FIGS. 1A, 1B and 1C. The processing unit 400 receives and processes the signals from microphones 110 and 120 to generate a de-noised signal as output. The processing unit 400 includes signal processing circuitry, which may be placed in the earpiece 150, in a headset assembly that includes the earpiece 150, or in the device 100. Alternatively, a portion of the signal processing circuitry may be placed in the earpiece 150 or the headset assembly, and the other portion of the signal processing circuitry may be placed in the device 100. The processing unit 400 may include hardware, software, firmware, or a combination thereof.

In the embodiment shown in FIG. 4, the processing unit 400 includes a filter 410 with fixed filter coefficients calibrated offline; e.g., by a manufacture of the earpiece 150. The filter coefficients are calibrated to remove the noise in the signal received from the in-ear microphone 110, where the noise comes from the outside noise that leaks into the user's ear. The offline calibration may be performed based on noise measurements when typical users (e.g., with a typical ear structure) wear the earpiece 150 in a typical manner. The filter 410 with fixed filter coefficients can perform well in typical environments. For users with an atypical ear structure or atypical style of wearing the earpiece 150, the adaptive filter 310 of FIG. 3 may be used.

Figure 5:
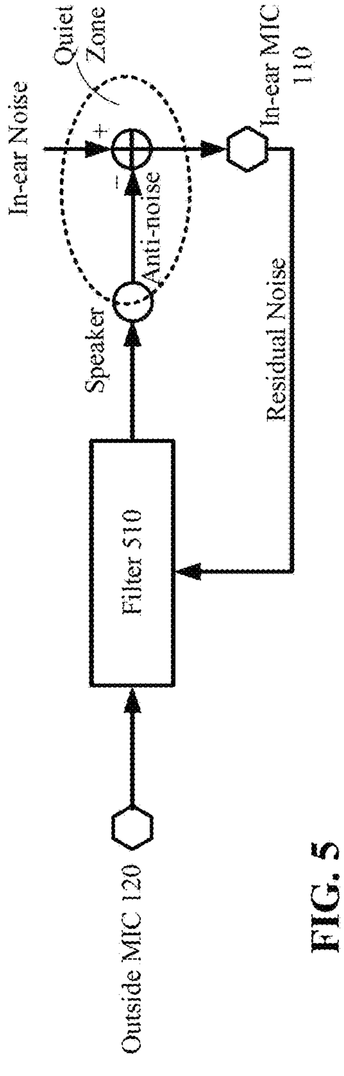
FIG. 5 illustrates acoustic active noise cancellation according to one embodiment.

FIG. 5 illustrates acoustic active noise cancellation that may be used in the earpiece 150 in one embodiment. The acoustic active noise cancellation reduces the in-ear noise by producing an anti-noise. The anti-noise is an acoustic wave transmitted from the speaker 130 to the user's ear canal to produce a quiet zone in the ear canal. In one embodiment, the anti-noise may be generated by a filter 510 such as an LMS filter, a Filter-X LMS filter, or other types of adaptive filters. The filter 510 receives the outside noise from the outside microphone 120 and a residual noise as input. The residual noise is the amount of noise transmitted from the in-ear microphone 110, after the anti-noise and the in-ear noise are combined. The residual noise feeds back to the filter 510 for the filter 510 to adapt its coefficients. In an alternative embodiment, the filter 510 may have fixed coefficients for similar reasons as described in connection with FIG. 4. The filter 510 with fixed coefficients may generate the anti-noise using the outside noise from the outside microphone 120 as input; the residual noise is neither computed nor used.

As described previously, the earpiece 150 may include multiple in-ear microphones 110 and/or multiple outside microphones 120 to improve SNR. Moreover, in some embodiments, the earpiece 150 may include multiple speakers 130, arranged in a linear, 2D or 3D pattern, to enhance the quality of the anti-noise delivered to the user's ear. With multiple speakers 130, both the quiet zone and the noise attenuation level can be improved.

In one embodiment, the acoustic active noise cancellation may be used in combination with the digital active noise cancellation. Digital active noise cancellation, as described in connection with FIGS. 3 and 4, reduces the noise in the signals that are received and transmitted by the microphones 110 and 120. The noise removal is performed by digital signal processing on the noisy signals picked up by the microphones 110 and 120; the noise level perceived by the user wearing the earpiece 150 (i.e., the noise in the user's ear canal) is not reduced. However, when the digitally processed signal is sent to another person who is having a conversation with the user, the perceived signal quality by that person is improved. By contrast, acoustic active noise cancellation reduces the noise level perceived by the user by creating a quiet zone in the user's ear. Thus, the signal quality picked up by the microphones 110 and 120 is improved. When the acoustic active noise cancellation is used in combination with the digital active noise cancellation, the noise reduction in the user's ear canal by acoustics active noise cancellation reduces the amount of noise that digital active noise cancellation needs to remove. Thus, the combination of both the acoustic and digital means may further improve the resulting signal quality.

Figure 6:
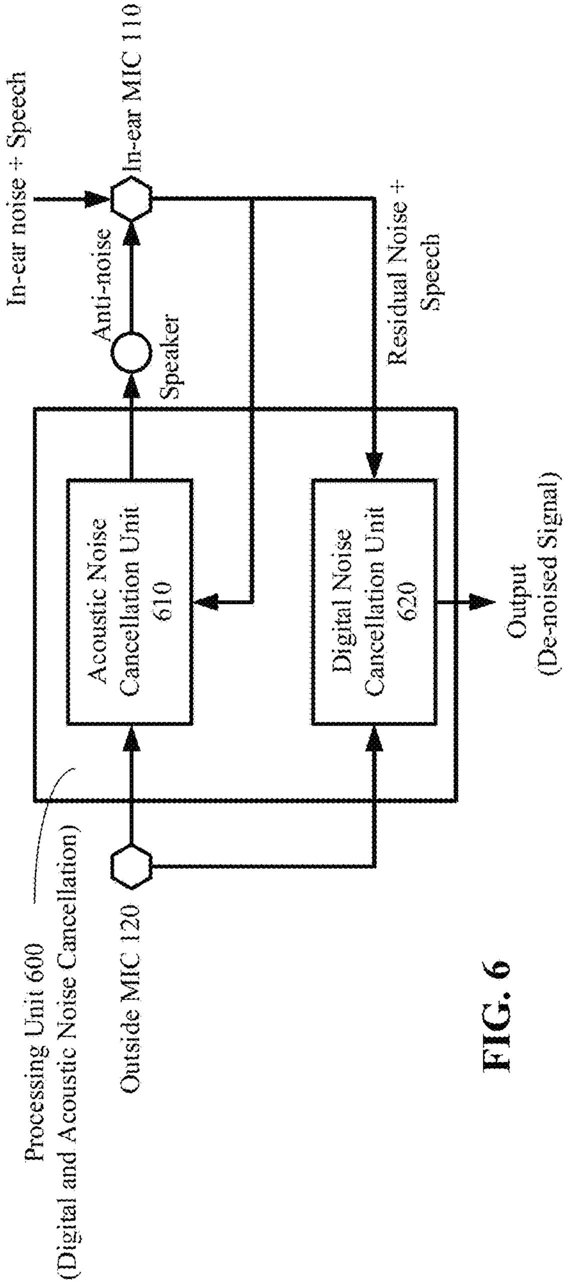
FIG. 6 illustrates a processing unit that performs both digital and acoustic active noise cancellation according to one embodiment.

FIG. 6 illustrates a processing unit 600 that combines both acoustic active noise cancellation and digital active noise cancellation according to one embodiment. The processing unit 600 is another example of the processing unit 160 in FIGS. 1A, 1B and 1C. The processing unit 600 receives and processes the signals from microphones 110 and 120 to generate a de-noised signal as output. The processing unit 600 includes signal processing circuitry, which may be placed in the earpiece 150, in a headset assembly that includes the earpiece 150, or in the device 100. Alternatively, a portion of the signal processing circuitry may be placed in the earpiece 150 or the headset assembly, and the other portion of the signal processing circuitry may be placed in the device 100. The processing unit 600 may include hardware, software, firmware, or a combination thereof.

In the embodiment shown in FIG. 6, the processing unit 600 includes an acoustic noise cancellation unit 610 (e.g., the filter 510 of FIG. 5) and a digital noise cancellation unit 620 (e.g., the processing unit 300 of FIG. 3 or the processing unit 400 of FIG. 4). As described previously, the output of the acoustic noise cancellation unit 610 is anti-noise, which after combined with the signal received from the in-ear microphone 110, feeds into the digital noise cancellation unit 620 together with the outside noise from the outside microphone 120. The output of the digital noise cancellation unit 620 is a de-noised signal.

Figure 7:
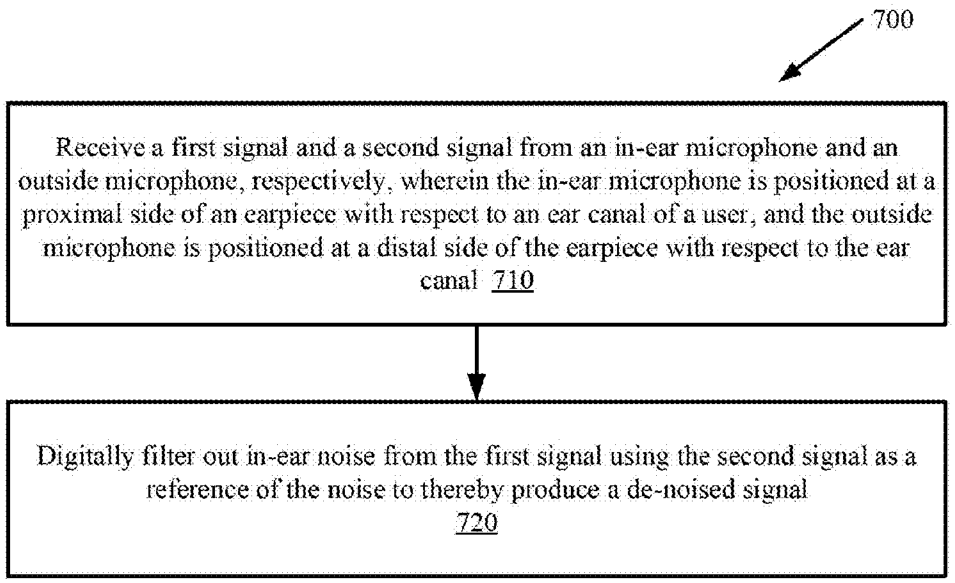
FIG. 7 is a flow diagram illustrating a method for enhancing microphone signals transmitted from an earpiece of a headset according to one embodiment.

FIG. 7 is a flow diagram illustrating a method 700 for enhancing microphone signals transmitted from an earpiece of a headset according to one embodiment. In one embodiment, the method 700 is performed by a processing circuitry, such as the processing unit of FIGS. 1A, 1B, 1C, 3, 4, 6 and 8. The processing circuitry may be in the earpiece, in a device that is in communication with the earpiece, or partially in the earpiece and partially in the device. The method 700 begins with the processing circuitry receiving a first signal and a second signal from an in-ear microphone and an outside microphone, respectively (step 710). The in-ear microphone is positioned at a proximal side of an earpiece with respect to an ear canal of a user, and the outside microphone is positioned at a distal side of the earpiece with respect to the ear canal. The processing circuitry digitally filters out in-ear noise from the first signal using the second signal as a reference to thereby produce a de-noised signal (step 720). Further signal enhancement, such as acoustic active noise cancellation and frequency shaping, may also be performed.

Figure 8:
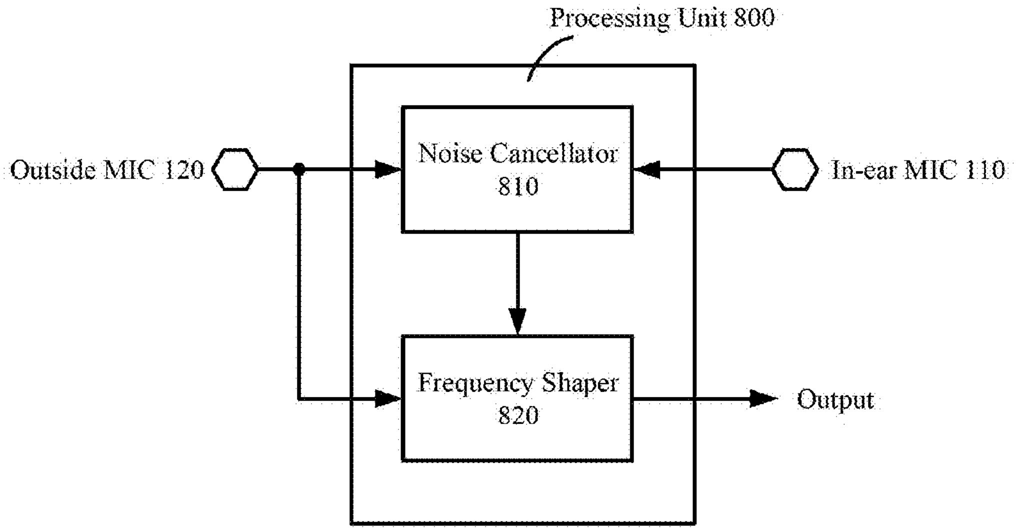
FIG. 8 illustrates a processing unit that performs frequency shaping in addition to active noise cancellation according to one embodiment.

FIG. 8 illustrates another processing unit 800 that performs frequency shaping in addition to active noise cancellation according to yet another embodiment. The processing unit 800 is another example of the processing unit 160 in FIGS. 1A, 1B and 1C. The processing unit 800 receives and processes the signals from microphones 110 and 120 to generate an enhanced signal as output. The processing unit 800 includes signal processing circuitry, which may be placed in the earpiece 150, in a headset assembly that includes the earpiece 150, or in the device 100. Alternatively, a portion of the signal processing circuitry may be placed in the earpiece 150 or the headset assembly, and the other portion of the signal processing circuitry may be placed in the device 100. The processing unit 800 may include hardware, software, firmware, or a combination thereof.

In one embodiment, the processing unit 800 includes a noise cancellator 810 and a frequency shaper 820. The noise cancellator 810 may perform digital active noise cancellation, acoustic active noise cancellation, or a combination of both, as shown in FIGS. 3-6. The frequency shaper 820 further improves the signal quality of the de-noised signal output from the noise cancellator 810, by shaping the frequencies of the de-noised signal.

In some embodiments, the high frequency band (e.g., above 2 KHz) of a user's voice when propagating through the Eustachian tube may be degraded, distorted or even lost. As a result, the speech signal received by the in-ear microphone 110 may sound muffled and in some cases may be unintelligible. In one embodiment, the frequency shaper 820 uses a predetermined filter or other signal processing means to amplify the energy of the high frequency band of the de-noised signal in order to improve the speech quality and intelligibility. In another embodiment, the frequency shaper 820 combines the high frequency band of the signal received from the outside microphone 120 with the de-noised signal to compensate for the high frequency distortion to the de-noised signal. The frequency shaper 820 may take the de-noised signal from the noise cancellator 810 and the signal from the outside microphone 120 as input, and generate an enhanced signal as output.

Figure 9:
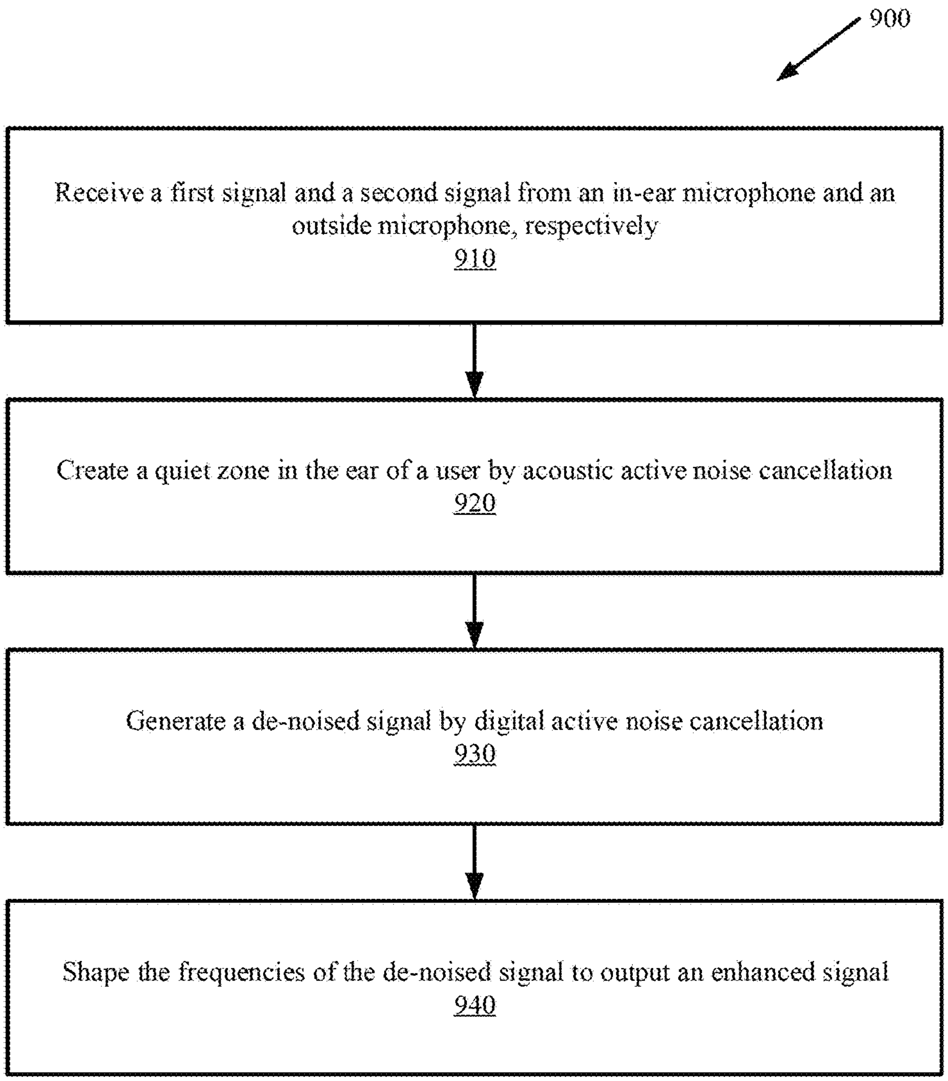
FIG. 9 is a flow diagram illustrating a method for enhancing microphone signals transmitted from an earpiece of a headset according to another embodiment.

FIG. 9 is flowchart illustrating a method 900 for enhancing microphone signals transmitted from an earpiece of a headset according to another embodiment. In one embodiment, the method 900 is performed by a processing circuitry, such as the processing unit of FIGS. 1A, 1B, 1C and 8. The processing circuitry may be in the earpiece, in a device that is in communication with the earpiece, or partially in the earpiece and partially in the device. The method 900 begins with the processing circuitry receiving a first signal and a second signal from an in-ear microphone and an outside microphone, respectively (step 910). The processing circuitry creates a quiet zone in the ear of a user by acoustic active noise cancellation (step 920). The processing circuitry then generates a de-noised signal by digital active noise cancellation (step 930). The processing circuitry further shapes the frequencies of the de-noised signal by compensating for high frequency distortion (step 940).

It is understood that the processing unit 160 of FIGS. 1A, 1B, and 1C may perform some or all of the steps 910-940. For example, the processing unit 160 may perform digital active noise cancellation only. The processing unit 160 may alternatively perform digital active noise cancellation in combination with acoustic active noise cancellation. In yet another embodiment, the processing unit 160 may perform digital and/or acoustic active noise cancellation in combination with frequency shaping.

The operations of the flow diagrams of FIGS. 7 and 9 have been described with reference to the exemplary embodiments of FIGS. 1A-1E, 2-6 and 8. However, it should be understood that the operations of the flow diagrams of FIGS. 7 and 9 can be performed by embodiments of the invention other than those discussed with reference to FIGS. 1A-1E, 2-6 and 8, and the embodiments discussed with reference to FIGS. 1A-1E, 2-6 and 8 can perform operations different than those discussed with reference to the flow diagrams. While the flow diagrams of FIGS. 7 and 9 show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method for enhancing a speech signal received from an earpiece of a headset worn by a user who produces the speech signal, comprising:

receiving a first signal and a second signal from an in-ear microphone and an outside microphone, respectively, wherein the in-ear microphone is positioned at a proximal side of the earpiece with respect to an ear canal of the user, and the outside microphone is positioned at a distal side of the earpiece with respect to the ear canal, and wherein the first signal includes the speech signal propagating through the user's Eustachian tube while the user is speaking;

receiving the second signal as input to a digital filter to generate an output as in-ear noise; and removing, by a combiner, the output of the digital filter from the first signal and outputting a de-noised signal of the speech signal.

2. The method of claim 1, wherein receiving the second signal as input further comprises:

calculating and updating coefficients of an adaptive filter when the speech signal is not detected in the first signal.

3. The method of claim 1, wherein receiving the second signal as input further comprises:

digitally filtering out the in-ear noise using a set of pre-calibrated filter coefficients.

4. The method of claim 1, further comprising:

generating, by one or more speakers in the earpiece, acoustic signals in the ear canal as anti-noise based on an output of a second filter that receives the second signal as input.

5. The method of claim 4, wherein the input to the second filter further includes a residual noise signal, which is a result of combining the anti-noise and the in-ear noise.

6. The method of claim 1, further comprising:

digitally filtering out the in-ear noise by combining a plurality of signals received from a plurality of microphones that include one or more in-ear microphones and one or more outside microphones.

7. The method of claim 1, further comprising:

increasing energy in a predetermined frequency band of the de-noised signal, wherein the predetermined frequency band is above a frequency threshold.

8. The method of claim 1, further comprising:

combining a predetermined frequency band of the second signal with the de-noised signal, wherein the predetermined frequency band is above a frequency threshold.

9. The method of claim 1, further comprising;

enhancing the speech signal by performing operations at least partially in the earpiece or in a headset assembly including the earpiece.

10. The method of claim 1, further comprising;

enhancing the speech signal by performing operations at least partially in a device in communication with the earpiece.

11. An apparatus for enhancing a speech signal received from an earpiece of a headset worn by a user who produces the speech signal, comprising:

an in-ear microphone positioned at a proximal side of the earpiece with respect to an ear canal of the user to receive a first signal, wherein the first signal includes the speech signal propagating through the user's Eustachian tube while the user is speaking;

an outside microphone positioned at a distal side of the earpiece with respect to the ear canal to receive a second signal; and a processing unit including a digital filter and a combiner, the digital filter to receive the second signal as input and to generate an output as in-ear noise, and the combiner to remove the output of the digital filter from the first signal and to output a de-noised signal of the speech signal.

12. The apparatus of claim 11, wherein the processing unit further comprises a voice activity detector operative to calculate and update coefficients of the digital filter when the speech signal is not detected in the first signal.

13. The apparatus of claim 11, wherein the digital filter is operative to digitally filter out the in-ear noise using a set of pre-calibrated filter coefficients.

14. The apparatus of claim 11, further comprising:

a second filter that receives the second signal as input; and one or more speakers in the earpiece operative to generate acoustic signals in the ear canal as anti-noise based on an output of the second filter.

15. The apparatus of claim 14, wherein the second filter further receives a residual noise signal as the input, wherein the residual signal is a result of combining the anti-noise and the in-ear noise.

16. The apparatus of claim 11, further comprising:

a plurality of microphones that include one or more in-ear microphones and one or more outside microphones, wherein the filter is operative to filter out the in-ear noise by combining a plurality of signals received from the plurality of microphones.

17. The apparatus of claim 11, wherein the processing unit is further operative to:

increase energy in a predetermined frequency band of the de-noised signal, wherein the predetermined frequency band is above a frequency threshold.

18. The apparatus of claim 11, wherein the processing unit is further operative to:

combine a predetermined frequency band of the second signal with the de-noised signal, wherein the predetermined frequency band is above a frequency threshold.

19. The apparatus of claim 11, wherein both the in-ear microphone and the outside microphone are to be positioned within a pinna of an ear of the user.

20. The apparatus of claim 11, wherein the processing unit is at least partially located in the earpiece or a headset assembly including the earpiece.

* * * * *